United States Patent [19]
Kobayashi

[11] Patent Number: 5,858,855
[45] Date of Patent: Jan. 12, 1999

[54] SEMICONDUCTOR SUBSTRATE, PROCESS FOR PRODUCTION THEREOF, AND SEMICONDUCTOR DEVICE

[75] Inventor: Kenya Kobayashi, Tokyo, Japan

[73] Assignee: NEC Corporation, Tokyo, Japan

[21] Appl. No.: 874,737

[22] Filed: Jun. 13, 1997

[30] Foreign Application Priority Data

Jun. 20, 1996 [JP] Japan ..................... 8-159723

[51] Int. Cl.$^6$ ................................... H01L 21/76

[52] U.S. Cl. ......................... 438/406; 438/407

[58] Field of Search ..................... 438/406, 407

[56] References Cited

U.S. PATENT DOCUMENTS

| | | | |
|---|---|---|---|
| 4,948,748 | 8/1990 | Kithara et al. | 438/406 |
| 5,234,535 | 8/1993 | Beyer et al. | 438/406 |
| 5,298,449 | 3/1994 | Kikuchi | 438/406 |
| 5,308,776 | 5/1994 | Gotou | 438/406 |
| 5,346,848 | 9/1994 | Grupen-Shemansky et al. | 438/406 |
| 5,444,014 | 8/1995 | Ryum et al. | 438/406 |
| 5,476,809 | 12/1995 | Kobayashi | 438/406 |
| 5,478,758 | 12/1995 | Easter | 438/406 |
| 5,529,947 | 6/1996 | Okonogi | 438/406 |
| 5,573,972 | 11/1996 | Kobayashi | 438/406 |
| 5,616,512 | 4/1997 | Ronsisvalle | 438/406 |

OTHER PUBLICATIONS

Furukawa et al, "Applications of the Silicon Wafer Direct-Bonding Technique to Electron Devices", Applied Surface Science, vol. 41/42, pp. 627–632, 1989.

Nakagawa, et al. "Bipolar–Mode MOSFETs Fabricated By Silicon–Wafer Direct Bonding", Toshiba Review, vol. 41, No. 12, pp. 1000–1003 (1986).

Primary Examiner—John F. Niebling
Assistant Examiner—Michael S. Lebentritt
Attorney, Agent, or Firm—Whitman, Curtis & Whitham

[57] ABSTRACT

The present invention relates to a semiconductor substrate which is a composite substrate obtained by (1) forming, on one side of a first single-crystal silicon substrate of first conductivity and low impurity content, a polycrystalline silicon layer of first conductivity and higher impurity content than the impurity content of the first single-crystal silicon substrate, which layer later becomes a life-time killer of a second-conductivity carrier, (2) bonding, on the polycrystalline silicon layer, a second single-crystal silicon substrate of second conductivity and high impurity content, and (3) subjecting the resulting bonded wafer to a heat treatment, as well as to a process for production of the semiconductor substrate. The present invention relates particularly to a semiconductor substrate useful for formation of a vertical power semiconductor device and a process for production of the semiconductor substrate. The present invention relates also to a semiconductor device obtained using the above semiconductor substrate.

6 Claims, 5 Drawing Sheets

SEMICONDUCTOR SUBSTRATE, PROCESS FOR PRODUCTION THEREOF, AND SEMICONDUCTOR DEVICE

BACKGROUND OF THE INVENTION

1. Field of the Invention

The present invention relates to a semiconductor substrate, a process for production thereof, and a semiconductor device; particularly to a semiconductor substrate suitably used in formation of a vertical power semiconductor device, and a process for production of the semiconductor substrate.

2. Description of the Related Art

Power semiconductor devices such as IGBT (insulated-gate bipolar transistor), thyristor and the like have a pnpn four-layer structure and are superior in on-resistance characteristic; therefore, they are in use in the fields requiring a relatively high breakdown voltage or a large electric current. An example of power semiconductor devices is a vertical IGBT which comprises a $p^+$ type single-crystal silicon substrate (this becomes a collector), an $n^-$ type base layer formed thereon, a $p^-$ type base layer formed thereon, an emitter (a $n^+$ type diffusion layer) formed thereon, and a gate electrode formed thereon via an insulating film. The $n^-$ type base layer of this vertical IGBT is formed in a fairly large thickness so as to have a high breakdown voltage and has a high resistance.

Processes for producing a substrate for vertical IGBT includes a process which comprises forming an $n^-$ type single-crystal silicon epitaxial layer on a $p^+$ type single-crystal silicon substrate. This process, however, has a limitation in achieving a high resistance and a large thickness.

For production of a substrate capable of achieving a high breakdown voltage, a process of directly bonding two substrates is disclosed in Toshiba Review, Vol. 41, No. 12, pp. 1000–1003 (1986). FIGS. 5(a) to 5(d) are sectional views showing the steps employed in producing a substrate according to the above process of direct bonding. First, phosphorus ion is implanted into a $n^-$ type single-crystal silicon substrate (1) to form an $n^+$ type buffer layer (21) [FIGS. 5(a) and 5(b)]. Into the $n^+$ type buffer layer is implanted boron ion to form a thin $p^+$ diffusion layer (22) [FIG. 5(c)]. Then, on the $p^+$ type diffusion layer side of the $n^-$ type silicon substrate is bonded to a $p^+$ type single-crystal silicon substrate (3), and the bonded wafer is heat-treated. Thus, a $n^-/n^+/p^+$ three-layer substrate is completed [FIG. 5(d)]. In this way, a high-resistance layer is formed on a low-resistance substrate.

In the above process, the $n^+$ type buffer layer (21) is formed in order to suppress the minority carrier (holes in this case) which is implanted from the $p^+$ type single-crystal silicon substrate (3) into the $n^-$ type single-crystal silicon substrate (1) ($n^-$ type base layer) when the device obtained using the three-layer substrate is in an on-state. As the total amount of impurity in the $n^+$ type buffer layer is larger, the recombination probability of carrier is higher, serving to shorten the turn-off time of device.

In the $n^-/n^+/p^+$ three-layer substrate produced by, for example, the above process of direct bonding of two single-crystal silicon substrates, since the amount of the holes implanted into the $n^-$ type base layer is determined only by the total amount of impurity in the $n^+$ type buffer layer, the shortening of turn-off time of device has had a limitation. Also, in bonding of two single-crystal silicon substrates, there have been problems of small bonding strength and easy generation of voids at the interface of the two substrates.

SUMMARY OF THE INVENTION

An object of the present invention is to provide a semiconductor substrate wherein there is used, as the buffer layer used in conventional vertical IGBT, etc., a polycrystalline silicon layer of high impurity content and, as a result, the implanting of minority carrier from the substrate of opposite conductivity and high impurity content into the base layer is suppressed and the turn-off of device can be conducted in a short time; and a semiconductor device obtained using the semiconductor substrate. Another object of the present invention is to provide a semiconductor substrate having a bonding strength higher than that of a semiconductor substrate obtained by direct bonding of two single-crystal silicon substrates.

The first aspect of the present invention lies in a semiconductor substrate which is a composite substrate obtained by (1) forming, on one side of a first single-crystal silicon substrate of first conductivity and low impurity content, a polycrystalline silicon layer of first conductivity and higher impurity content than the impurity content of the first single-crystal silicon substrate, which layer later becomes a life-time killer of a second-conductivity carrier, (2) bonding, on the polycrystalline silicon layer, a second single-crystal silicon substrate of second conductivity and high impurity content, and (3) subjecting the resulting bonded wafer to a heat treatment.

The second aspect of the present invention lies in a semiconductor substrate which is a composite substrate obtained by (1) forming, on one side of a first single-crystal silicon substrate of first conductivity and low impurity content, a polycrystalline silicon layer of first conductivity and higher impurity content than the impurity content of the first single-crystal silicon substrate, which layer later becomes a life-time killer of a second-conductivity carrier, (2) forming, on one side of a second single-crystal silicon substrate of second conductivity and high impurity content, a polycrystalline silicon layer of second conductivity and high impurity content, (3) bonding the two substrates so that the respective polycrystalline silicon layers come in contact with each other, and (4) subjecting the resulting bonded wafer to a heat treatment.

The third aspect of the present invention lies in a semiconductor substrate which is a composite substrate obtained by (1) forming, on one side of a first single-crystal silicon substrate of first conductivity and low impurity content, a polycrystalline silicon layer of first conductivity and higher impurity content than the impurity content of the first single-crystal silicon substrate, which layer later becomes a life-time killer of a second-conductivity carrier, (2) forming, on one side of a second single-crystal silicon substrate of second conductivity and high impurity content, an intrinsic polycrystalline silicon layer, (3) bonding the two substrates so that the respective polycrystalline silicon layers come in contact with each other, and (4) subjecting the resulting bonded wafer to a heat treatment.

The fourth aspect of the present invention lies in a vertical power semiconductor device obtained by using a semiconductor substrate of any of the first to third aspects of the present invention.

The fifth aspect of the present invention lies in a process for producing a semiconductor substrate, which comprises (1) forming, on one side of a first single-crystal silicon substrate of first conductivity and low impurity content, a polycrystalline silicon layer of first conductivity and higher impurity content than the impurity content of the first single-crystal silicon substrate, which layer later becomes a life-time killer of a second-conductivity carrier, (2) bonding, on the polycrystalline silicon layer, a second single-crystal silicon substrate of second conductivity and high impurity content, (3) subjecting the resulting bonded wafer to a heat treatment to obtain a composite substrate, and then (4) forming a vertical power semiconductor device.

The sixth aspect of the present invention lies in a process for producing a semiconductor substrate, which comprises (1) forming, on one side of a first single-crystal silicon substrate of first conductivity and low impurity content, a polycrystalline silicon layer of first conductivity and higher impurity content than the impurity content of the first single-crystal silicon substrate, which layer later becomes a life-time killer of a second-conductivity carrier, (2) forming, on one side of a second single-crystal silicon substrate of second conductivity and high impurity content, a polycrystalline silicon layer of second conductivity and high impurity content, (3) bonding the two substrates so that the respective polycrystalline silicon layers come in contact with each other, (4) subjecting the resulting bonded wafer to a heat treatment to obtain a composite substrate, and then (5) forming a vertical power semiconductor device.

The seventh aspect of the present invention lies in a process for producing a semiconductor substrate, which comprises (1) forming, on one side of a first single-crystal silicon substrate of first conductivity and low impurity content, a polycrystalline silicon layer of first conductivity and higher impurity content than the impurity content of the first single-crystal silicon substrate, which layer later becomes a life-time killer of a second-conductivity carrier, (2) forming, on one side of a second single-crystal silicon substrate of second conductivity and high impurity content, an intrinsic polycrystalline silicon layer, (3) bonding the two substrates so that the respective polycrystalline silicon layers come in contact with each other, (4) subjecting the resulting bonded wafer to a heat treatment to obtain a composite substrate, and then (5) forming a vertical power semiconductor device.

The first effect of the present invention is that the turn-off of device can be conducted in a short time. The reason is that the implanting of minority carrier from the single-crystal silicon substrate of high impurity content and second conductivity into the base layer of first conductivity and low impurity content when the device is in an on-state is suppressed by the presence of the polycrystalline silicon layer of high impurity content and first conductivity.

The second effect of the present invention is that the composite substrate obtained by bonding two substrates has a high bonding strength. The reason is that the heat treatment applied gives rise to recrystallization of polycrystalline silicon in the vicinity of the interface of the two substrates. The present invention also has an effect of suppressing the generation of voids at the interface of the two substrates.

DETAILED DESCRIPTION OF THE PREFERRED EMBODIMENTS

Example 1

Figure 1A:
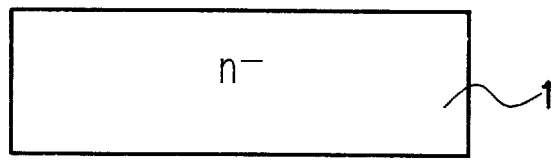
FIGS. 1(a) to 1(d) are sectional views showing the steps employed in production of a semiconductor substrate of the present invention.
Figure 1B:
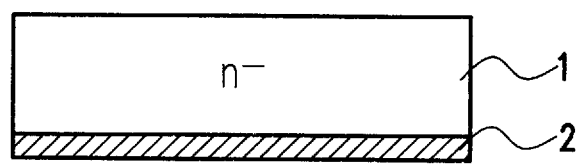
Figure 1C:
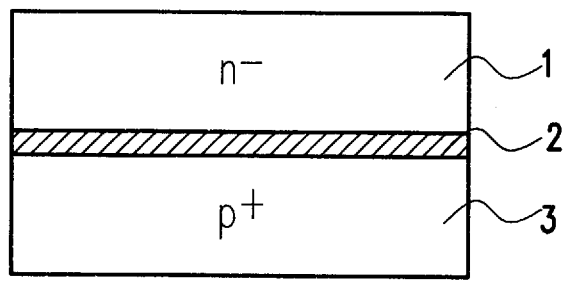
Figure 1D:
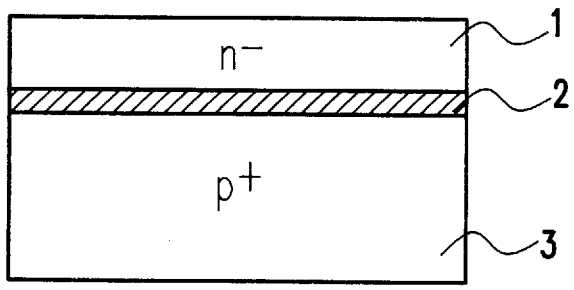
Figure 2:
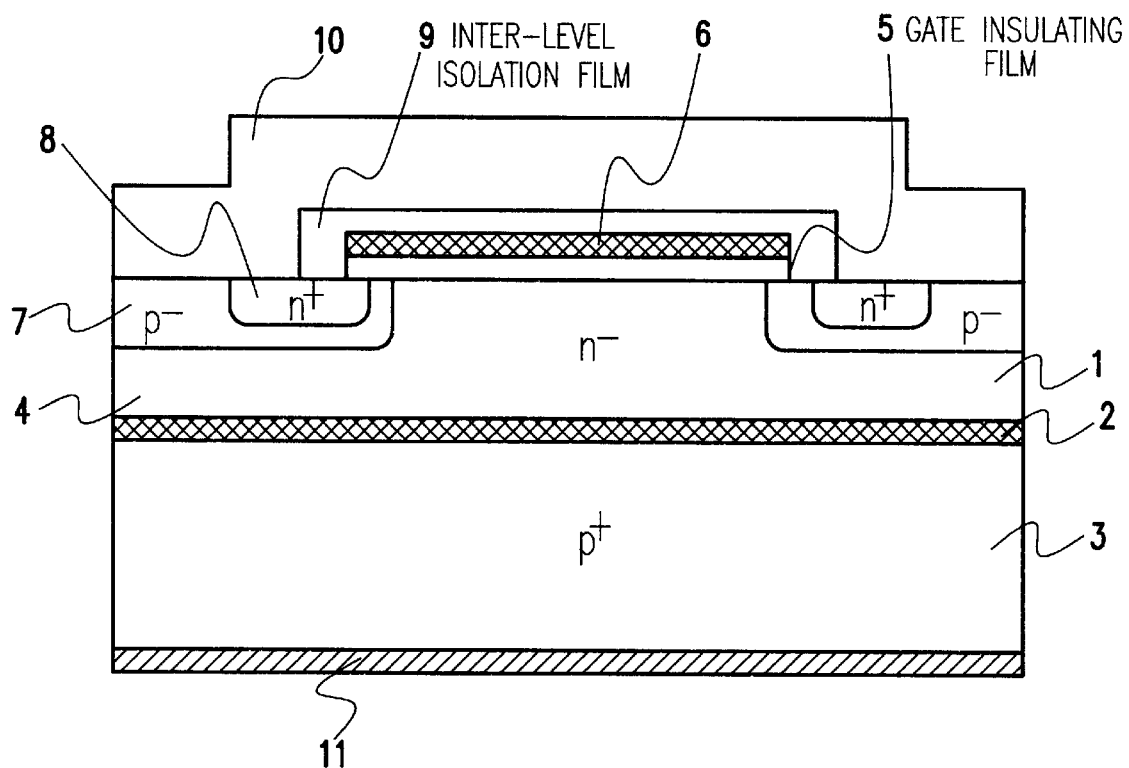
FIG. 2 is a sectional view showing a semiconductor device produced using a semiconductor substrate of the present invention.

FIGS. 1(a) to 1(d) are sectional views showing the steps employed in a first example of production of the semiconductor substrate of the present invention; and FIG. 2 is a sectional view showing a vertical IGBT produced using a semiconductor substrate produced in this production example. First, an n⁻ type single-crystal silicon substrate (1) of high resistance is prepared [FIG. 1(a)]. The resistivity of this n⁻ type single-crystal silicon substrate is determined by the breakdown voltage required for a device to be formed later and, when a breakdown voltage of several hundreds V to over 1,000 V is needed, is desirably several tens Ωcm to over 100 Ωcm. The thickness of the n⁻ type single-crystal silicon substrate may be an ordinary thickness of about 600 μm in the case of, for example, 6 inches in diameter because grinding and polishing are conducted later; however, the thickness is preferably at least a level required from the properties of device, for example, at least about 100 μm when the breakdown voltage is 1,000 V.

Then, as shown in FIG. 1(b), on the n⁻ type single-crystal silicon substrate (1) is formed an n⁺ type polycrystalline silicon layer (2) of low resistance in a thickness of several μm, at about 600°–1,200° C. by CVD or the like. Desirably, the layer (2) is formed so as to have a resistivity of about $10^{-2}$ to $10^0$ Ωcm while antimony or arsenic is being added.

Successively, the surface of n⁺ type polycrystalline silicon layer (2) is polished by a mechanochemical method or the like to make the surface flat, after which the layer (2) is bonded to a p⁺ type single-crystal silicon substrate (3) of low resistance. The resulting bonded wafer is subjected to a heat treatment at about 1,000°–1,200° C. for about 1–2 hours to obtain a composite substrate of high bonding strength [FIG. 1(c)]. Incidentally, the resistivity of the p⁺ type single-crystal silicon substrate (3) is desirably about $10^{-3}$ to $10^{-2}$ cm.

Finally, the surface of the n⁻ type single-crystal silicon substrate (1) is ground and polished into a desired thickness [FIG. 1(d)].

Using the above-produced substrate, a vertical IGBT is formed by a known process (FIG. 2).

The operation of the vertical IGBT of FIG. 2 is explained. A positive voltage is applied to a gate polycrystalline silicon (6). When the voltage exceeds a threshold, channels are formed on a p⁻ type base layer (7) and electrons flow from an n⁺ type emitter layer (8) into an n⁻ type base layer (4). The electrons, which have flowed into the n⁻ type base layer (4), pass through an n⁺ type polycrystalline silicon layer (2) and are implanted into a p⁺ type single-crystal silicon substrate (3). Meanwhile, holes are implanted from the p⁺ type single-crystal silicon substrate (3) into the n⁺ type polycrystalline silicon layer (2) and the n⁻ type base layer (4). As a result, the device is in an on-state and an electric current flows from a collector electrode (11) to an emitter electrode (10). On the other hand, when the positive voltage applied to the gate polycrystalline silicon (6) is made a threshold or lower, the holes implanted into the n⁻ type base layer (4) move into the p⁻ type base layer (7) or the p⁺ type single-crystal silicon substrate (3), or recombination in the n⁻ type base layer (4) and disappear. As a result, the device is in an off-state.

Next, the effect of Example 1 of the present invention is described. In this example of the present invention, in the substrate of $n^-/n^+/p^+$ three-layer structure, the $n^+$ layer is a polycrystalline silicon layer of high impurity content; therefore, the implanting of holes from the $p^+$ layer into the $n^-$ layer when the device is in an on-state, is suppressed by a high concentration of electrons and silicon grain boundaries. As a result, the turn-off time is short and high-speed switching is possible.

The interface between the two bonded substrates consist of a polycrystalline silicon surface and a single-crystal silicon surface; therefore, recrystallization proceeds in the polycrystalline silicon layer including the vicinity of the above interface, owing to the heat treatment applied after bonding and the heat treatment applied during device formation. As a result, a composite substrate of high bonding strength can be obtained.

Example 2

Figure 3A:
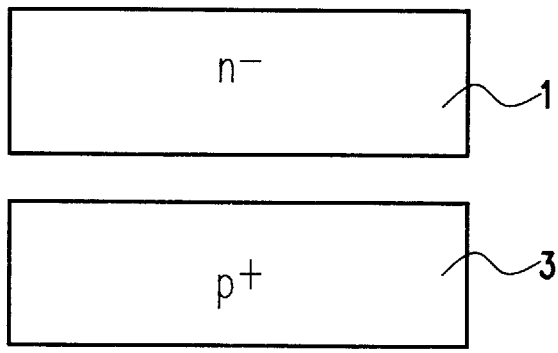
FIGS. 3(a) to 3(c) are sectional views showing the steps employed in production of a semiconductor substrate of the present invention.
Figure 3B:
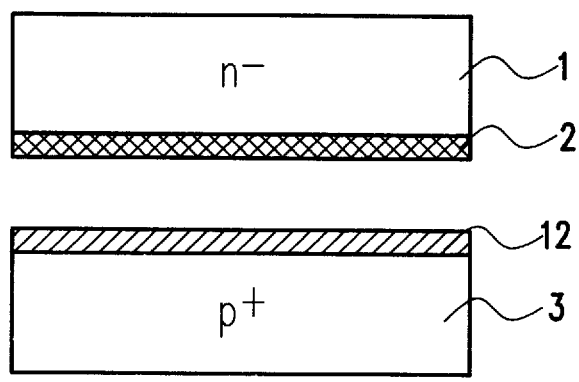
Figure 3C:
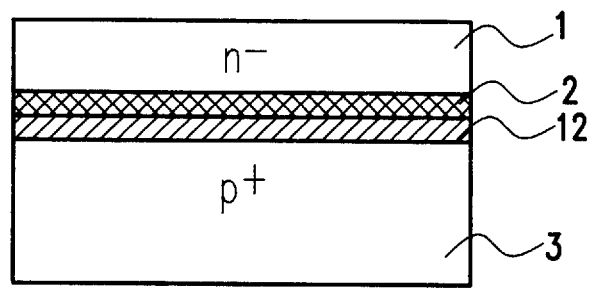

FIGS. 3(a) to 3(c) are sectional views showing the steps employed in a second example of production of the semiconductor substrate of the present invention. First, there are prepared an n type single-crystal silicon substrate (1) and a $p^+$ type single-crystal silicon substrate (3) [FIG. 1(a)].

Then, on the $n^-$ type single-crystal silicon substrate (1) and the $p^+$ type single-crystal silicon substrate (3) are formed an $n^+$ type polycrystalline silicon layer (2) and a $p^+$ type polycrystalline silicon layer (12), respectively, each in a thickness of several μm [FIG. 3(b)]. The $p^+$ type polycrystalline silicon layer (12) is formed by CVD or the like similarly to the formation of the $n^+$ type polycrystalline silicon layer (2) and, by boron addition, is allowed to have about the same resistivity as the $p^+$ type single-crystal silicon substrate (3).

Successively, the surfaces of the $n^+$ type polycrystalline silicon layer (2) and the $p^+$ type polycrystalline silicon layer (12) are polished to make the surfaces flat. The resulting two flat surfaces are bonded to each other. The resulting bonded wafer is subjected to a heat treatment to obtain a composite substrate having a high bonding strength [FIG. 1(c)].

In this example, the interface of the two bonded substrates are two polycrystalline silicon surfaces. In the interface, as in Example 1, recrystallization of polycrystalline silicon proceeds owing to the heat treatment; as a result, a composite substrate having a high bonding strength can be obtained.

Example 3

Figure 4A:
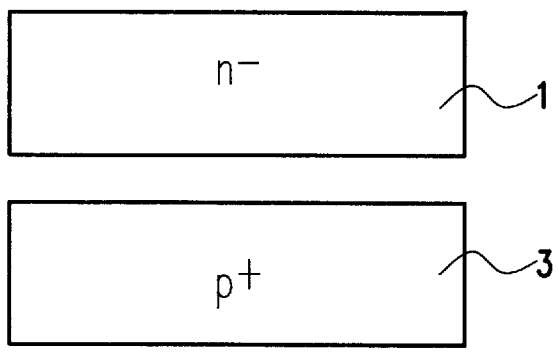
FIGS. 4(a) to 4(c) are sectional views showing the steps employed in production of a semiconductor substrate of the present invention.
Figure 4B:
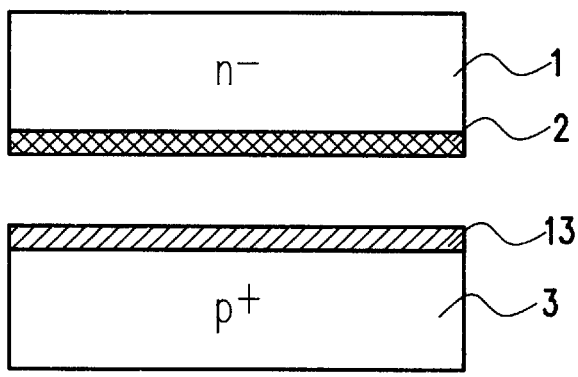
Figure 4C:
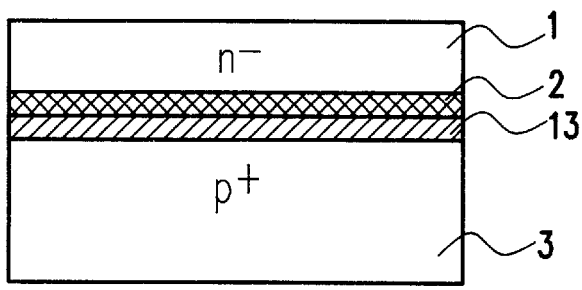
Figure 5A:
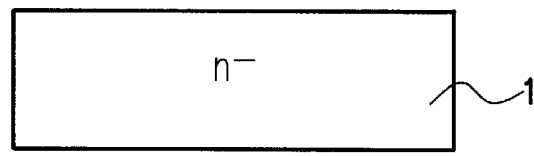
FIGS. 5(a) to 5(d) are sectional views showing the steps employed in production of a conventional semiconductor substrate.
Figure 5B:
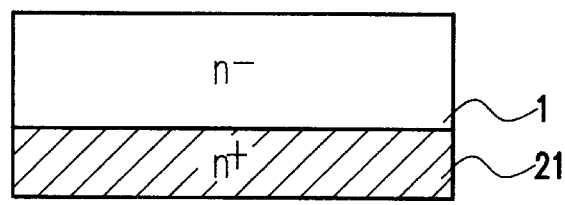
Figure 5C:
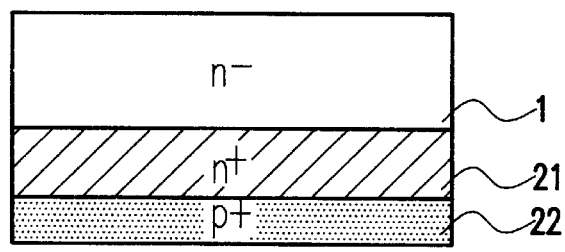
Figure 5D:
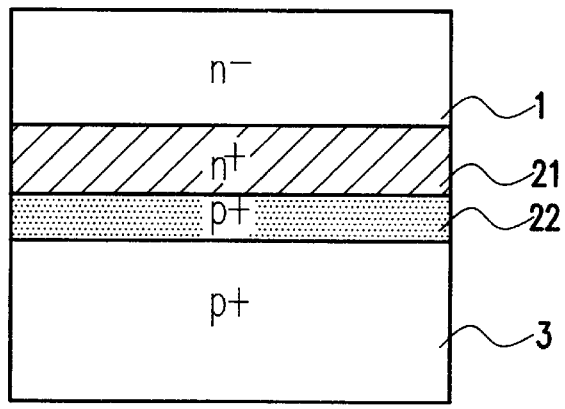

FIGS. 4(a) to 4(c) are sectional views showing the steps employed in a third example of production of the semiconductor substrate of the present invention. In this example, a composite substrate is produced in the same manner as in Example 2 except that there is formed, on a $P^+$ type single-crystal silicon substrate (3), a polycrystalline silicon layer (13) to which no impurity is added, in a thickness of several μm.

In this example, a polycrystalline silicon layer (13) to which no impurity is added, is present between a $n^+$ type polycrystalline silicon layer (2) and a $p^+$ type single-crystal silicon substrate (3). However, owing to the heat treatment applied after bonding and the heat treatment applied during device formation, there take place diffusion into the polycrystalline silicon layer (13), of n type impurity from the $n^+$ type polycrystalline silicon layer (2) and of p type impurity from the $p^+$ type single-crystal silicon substrate (3). As a result, in the polycrystalline silicon layer (13) are formed an $n^+$ type area and a $p^+$ type area in a certain concentration gradient. Therefore, addition of impurity to the polycrystalline silicon layer formed on the $p^+$ type single-crystal silicon substrate (the addition is conducted in Example 2) can be eliminated; and yet a sufficient effect can be obtained.

In the above, substrates of $n^-/n^+/p^+$ three-layer structure have been explained. Similar effects can also be obtained even in a substrate which has a $p^-/p^+/n^+$ three-layer structure (the order of pn is reversed) and wherein the minority carrier is electrons.

What is claimed is:

1. A process for producing a semiconductor substrate comprising:

(1) forming, on one side of a first single-crystal silicon substrate of first conductivity and low impurity content, a polycrystalline silicon layer of said first conductivity and higher impurity content than the impurity content of the first single-crystal silicon substrate, which layer later becomes a lifetime killer of a second-conductivity carrier;

(2) bonding, on the polycrystalline silicon layer, a second single-crystal silicon substrate of second conductivity and high impurity content;

(3) subjecting the resulting bonding wafer to a heat treatment to obtain a composite substrate; and (4) forming a vertical power semiconductor device.

2. A process for producing a semiconductor substrate comprising:

(1) forming, on one side of a first single-crystal silicon substrate of a first conductivity and low impurity content, a polycrystalline silicon layer of said first conductivity and higher impurity content than the impurity content of the first single-crystal silicon substrate, which layer later becomes a lifetime killer of a second-conductivity carrier;

(2) forming, on one side of a second single crystal silicon substrate of second conductivity and high impurity content, a polycrystalline silicon layer of said second conductivity and high impurity content;

(3) bonding the two substrates so that the respective polycrystalline silicon layers come in contact with each other;

(4) subjecting the resulting bonded wafer to a heat treatment to obtain a composite substrate; and (5) forming a vertical power semiconductor device.

3. A process for producing a semiconductor substrate comprising:

(1) forming, on one side of a first single-crystal silicon substrate of first conductivity and low impurity content, a polycrystalline silicon layer of said first conductivity and higher impurity content than the impurity content of the first single-crystal silicon substrate, which layer later becomes a lifetime killer of a second-conductivity carrier;

(2) forming, on one side of a second single-crystal silicon substrate of second conductivity and high impurity content, an intrinsic polycrystalline silicon layer;

(3) bonding the two substrates so that the respective polycrystalline silicon layers come in contact with each other;

(4) subjecting the resulting bonding wafer to a heat treatment to obtain a composite substrate; and (5) forming a vertical power semiconductor device.

4. A process for producing a semiconductor substrate according to claim 1, wherein the grinding and polishing of the other side of the first single-crystal silicon substrate is conducted between the heat treatment of the resulting bonded wafer and the formation of a vertical power semiconductor device.

5. A process for producing a semiconductor substrate according to claim 2, wherein the grinding and polishing of the other side of the first single-crystal silicon substrate is conducted between the heat treatment of the resulting bonded wafer and the formation of a vertical power semiconductor device.

6. A process for producing a semiconductor substrate according to claim 3, wherein the grinding and polishing of the other side of the first single-crystal silicon substrate is conducted between the heat treatment of the resulting bonded wafer and the formation of a vertical power semiconductor device.

* * * * *